US006630768B2

(12) United States Patent
Yamashiro et al.

(10) Patent No.: US 6,630,768 B2
(45) Date of Patent: Oct. 7, 2003

(54) ULTRASONIC CLEANING APPARATUS AND ULTRASONIC CLEANING METHOD

(75) Inventors: Takahisa Yamashiro, Utsunomiya (JP); Noriyuki Kitaori, Saitama (JP); Kiyoteru Osawa, Funabashi (JP); Masayasu Sato, Tochigi (JP)

(73) Assignee: Kao Corporation, Tokyo (JP)

( * ) Notice: Subject to any disclaimer, the term of this patent is extended or adjusted under 35 U.S.C. 154(b) by 0 days.

(21) Appl. No.: 09/964,441

(22) Filed: Sep. 28, 2001

(65) Prior Publication Data

US 2002/0036444 A1 Mar. 28, 2002

(30) Foreign Application Priority Data

Sep. 28, 2000 (JP) .................................... P2000-297392
Feb. 27, 2001 (JP) .................................... P2001-052872

(51) Int. Cl.[7] ............................................... H01L 41/09
(52) U.S. Cl. .................................. 310/317; 310/316.01
(58) Field of Search ........................ 310/316.01, 316.02

(56) References Cited

U.S. PATENT DOCUMENTS 3,293,456 A * 12/1966 Shoh ..................... 310/316.01
5,739,724 A * 4/1998 Alexandre et al. ..... 310/316.01
5,808,396 A * 9/1998 Boukhny .................... 310/318
6,161,418 A * 12/2000 Kraus et al. ................. 73/1.82

FOREIGN PATENT DOCUMENTS

| | | | | |
|---|---|---|---|---|
| DE | 4035828 | * | 2/2000 | ............. B06B/1/06 |
| EP | 0173761 A1 | * | 7/1988 | ............. B06B/1/02 |
| FR | 2536311 | * | 5/1984 | ............. B06B/1/02 |
| JP | 63-162086 | | 7/1988 | ........... B08B/19/00 |
| JP | 11-10438 | | 4/1999 | ............. D06F/3/12 |
| JP | 2000-167485 | * | 6/2000 | ............. B06B/1/06 |

* cited by examiner

*Primary Examiner*—Thomas M. Dougherty
(74) *Attorney, Agent, or Firm*—Birch, Stewart, Kolasch & Birch, LLP

(57) ABSTRACT

An ultrasonic cleaning apparatus comprises: a power amplifier for amplifying an amplitude of a signal to supply the signal as power to the ultrasonic oscillator; a phase comparator for obtaining a difference between a phase of a current flowing through the ultrasonic oscillator and a phase of a voltage applied to the ultrasonic oscillator and for generating a voltage in accordance with the phase difference; and a voltage control oscillation device for generating a frequency of the signal in accordance with the voltage generated by the phase comparator and for controlling the frequency so that the phase difference is kept within ±30°, wherein the power supplied to the ultrasonic oscillator is regulated to a range from 1W to 10W, and a difference between a resonance frequency of the ultrasonic oscillator and an anti-resonance frequency thereof is regulated to 1 kHz or more.

11 Claims, 12 Drawing Sheets

FIG.19

| | FORM | Cf | PARAUEL L | ANTI RESONANCE FREQUENCY-RESONANCE FREQUENCY | OSCILLATION STABILITY |
|---|---|---|---|---|---|
| EXAMPLE 1 | ROUND FLAT PHONE | 800-900pF | NONE | 0.9-1kHz | ○ |
| EXAMPLE 2 | 15w FLAT PHONE | 800-900pF | NONE | 1.71kHz | ◎ |
| EXAMPLE 3 | 11w FLAT PHONE | 800-900pF | NONE | 1kHz | ○ |
| EXAMPLE 4 | ↑ | ↑ | 1.5mH | 1.5kHz | ◎ |
| EXAMPLE 5 | 11w FLAT PHONE 2mm | 1750pF | NONE | 0.5kHz | △ |
| EXAMPLE 6 | ↑ | ↑ | 3.2mH | -0.8kHz | × |
| EXAMPLE 7 | ↑ | ↑ | 6mH | 1.5kHz | ◎ |
| EXAMPLE 8 | ↑ | ↑ | 10mH | 1.2kHz | ○ |

ULTRASONIC CLEANING APPARATUS AND ULTRASONIC CLEANING METHOD

BACKGROUND OF THE INVENTION

The present invention relates to an ultrasonic cleaning apparatus, more specifically to a household ultrasonic cleaning apparatus for cleaning, for example, fabrics, textile products and the like and an ultrasonic cleaning method.

As a technologies for cleaning dirty textile products and the like by use of an ultrasonic oscillator, a control apparatus of a washing machine disclosed in Japanese Patent Laid-Open No. 11(1999)-104388 has been heretofore known. In the control apparatus of a washing machine disclosed in this gazette, a partial cleaning unit which is pressed against dirty portions of clothes and removes the stains is constituted by a piezoelectric element, and electrical signals are supplied to the piezoelectric element by amplifying an amplitude of an output signal of a controller by an amplitude amplifier. Power is supplied from a power supplier to the amplitude amplifier, and an operation state of the piezoelectric element is detected by a state detector. Then, the control apparatus controls a frequency of the output signal of the controller so that the piezoelectric element and the amplitude amplifier are synchronized with each other by an output of the state detector.

In the ultrasonic cleaning apparatus, an oscillator is dipped in cleaning liquid while dipping the subject to be cleaned in the cleaning liquid, and stains attached to the subject to be cleaned are removed by propagating ultrasonic waves generated in an ultrasonic oscillation circuit to the subject to be cleaned. In this ease, impedance of an oscillation circuit changes along with a change of a depth of the cleaning liquid. To be specific, when stationary wave are generated, a secondary output current of a coupling transformer provided between an oscillator and the oscillation circuit drops. Therefore, there has been a problem that an oscillation amplitude of the ultrasonic oscillator becomes small and a cleaning capability of the ultrasonic cleaning apparatus is lowered.

As a technology for solving this problem, there has been an ultrasonic cleaning machine disclosed in Japanese Patent Laid-Open 63(1988)-162086. In this ultrasonic cleaning machine, an oscillation amplitude of an oscillation circuit is detected, and impedance of a coupling transformer when viewed from primary windings is made to be small by automatically controlling the coupling transformer by uses of the detected oscillation amplitude as a control quantity so that the number of secondary windings is large. Thus, a constant oscillation amplitude is obtained regardless of a change in a liquid depth and a level of a load.

Furthermore, in "Ultrasonic Technology" published by Corona Co. Ltd., p. 67, a principle for driving an oscillator by use of a phase synchronizing oscillator is described. In the phase synchronizing oscillator, current flowing through an oscillator or a voltage across the oscillator are detected, and a frequency of a voltage control oscillation circuit is controlled so that a phase difference between the detected voltage and the detected current approaches a predetermined level. Thus, the oscillator is driven while following a resonance frequency or a proper frequency near the resonance frequency.

However, in the control apparatus of the cleaning machine described in Japanese Patent Laid-Open No. 11(1999)-104388, a voltage/current characteristic makes a unique change for a frequency in case of an electrostriction piezoelectric element, so that an effective control cannot be performed.

In the ultrasonic cleaning machine disclosed in Japanese Patent Laid-Open No. 63(1988)-162086, since the number of the secondary windings of the coupling transformer is made to be large so that the constant oscillation amplitude is obtained regardless of the change of the liquid depth and the level of the load, the coupling transformer is large-sized and hence the cleaning machine itself is large-sized.

In the oscillator drive using the phase synchronizing oscillator, it is absolutely impossible to cope with phase jumping due to a stationary wave occured in cleaning liquid when the phase synchronizing oscillator is used. Moreover, since the phase of the voltage and the phase of the current are made to be coincident with each other irrespective of the change of the load, a large amount of waste is produced in low power consumption.

Furthermore, in the oscillator drive using the phase synchronizing oscillator, a resonance frequency rapidly changes owing to a change of a load when the oscillator is used in cleaning liquid, and hence the resonance point cannot be discriminated from an anti-resonance point. Thus, the oscillator may be uncontrollable. This is because the current and the voltage show an identical phase in the resonance point and the anti-resonance point and the resonance point and the anti-resonance point cannot be discriminated from each other by the phase synchronizing control.

In order to enhance a drivability of the cleaning apparatus when cleaning is performed temporarily, a more compact-sized cleaning apparatus is required. However, when an output of the cleaning apparatus is made to be small, the output is apt to be influenced by a load. On the other hand, the applied load always changes depending on conditions of clothes and the like. In such a compact-sized cleaning apparatus, the possible uncontrollability increases. Therefore, a stable ultrasonic oscillation circuit and an oscillation element showing excellent cleaning effects are necessary in the foregoing various situations.

SUMMARY OF THE INVENTION

An object of the present invention is to provide an ultrasonic cleaning apparatus capable of exhibiting excellent cleaning effects with less power and cleaning dirty clothes easily.

A first aspect of the present invention is an ultrasonic cleaning apparatus which cleans a subject to be cleaned by oscillations generated by an ultrasonic oscillator, the ultrasonic cleaning apparatus comprising: a power amplifier for amplifying an amplitude of a signal to supply the amplified signal to the ultrasonic oscillator; a phase comparator for determining a difference between a phase of a current flowing through the ultrasonic oscillator and a phase of a voltage applied to the ultrasonic oscillator to generate a voltage in accordance with the phase difference; and a voltage control oscillation device for generating a frequency of the signal in accordance with the voltage generated by the phase comparator and for controlling the frequency so that the phase difference is held within a predetermined phase range, wherein the power supplied to the ultrasonic oscillator is set to a range of 1W to 10W According to the first aspect of the present invention, the power supplied to the ultrasonic oscillator is set to the range of 1W to 10W, and the phase comparator generates the voltage in accordance with the phase difference between the current and the voltage. The voltage control oscillation device generates the frequency of the signal in accordance with the generated voltage, and controls the frequency so that the phase difference is held within the predetermined phase range. Therefore, effective power supplied to the ultrasonic oscillator can be increased, and influences of the phase shift due to the change of the load can be lessened.

In addition to the first aspect of the present invention, a second aspect of the present invention is characterized in that the voltage control oscillation device holds the phase difference to a range within ±30°.

According to the second aspect of the present invention, the effects of the first aspect of the present invention is made further surer.

Furthermore, in addition to the first and second aspects of the present invention, a third aspect of the present invention is characterized in that a difference between a resonance frequency of the ultrasonic oscillator and an anti-resonance frequency thereof is regulated to be 1 kHz or more.

In addition to the effects of the first and second aspects of the present invention, according to the third aspect of the present invention, since the difference between the resonance frequency of the ultrasonic oscillator and the anti-resonance frequency close to the resonance frequency is regulated to 1 kHz or more, stable oscillation with high efficiency can be achieved even when the load change occurs, in addition to the effects of the first and second aspects. When the plurality of resonance frequencies exist, the resonance frequency means a frequency at which impedance of the oscillator is the lowest, and the anti-resonance frequency is a frequency close to the resonance frequency, at which the impedance of the oscillator shows a high peak. Accordingly, an excellent cleaning effect can be exhibited with less power, and dirty clothes can be cleaned easily.

Noted that the resonance frequency means a frequency at which the oscillation is the largest and the impedance of the oscillator is low, and the anti-resonance frequency is a frequency at which the impedance of the oscillator is high.

BRIEF DESCRIPTION OF THE DRAWINGS

FIG. 19 is a table illustrating results obtained by measuring an oscillation stability owing to the difference between the resonance frequency and the anti-resonance frequency in the foregoing embodiments.

DETAILED DESCRIPTION OF THE PREFERRED EMBODIMENTS

The applicant of this application aimed at an oscillation characteristic and power efficiency of an oscillation element, and the optimized condition influenced on a cleaning effect has been found by controlling a phase difference between an alternating voltage and a current for a changing load. Moreover, the applicant aimed at the oscillation characteristic of the oscillation element, and found existence of a proper value between a resonance frequency of the oscillation element and an anti-resonance frequency thereof for a changing load. The applicant found that stable and high efficiency oscillation is made possible by controlling this value properly, and as a result found the optimized condition influenced on the cleaning effect.

Several embodiments of the ultrasonic cleaning apparatus according to the present invention will be described into detail with reference to the accompanying drawings.

In the following, a load state means a state where a subject to be cleaned is in contact with an ultrasonic cleaning apparatus, specifically an ultrasonic cleaning phone. On the contrary, no load state means a state where the subject to be cleaned is not in contact with an ultrasonic cleaning apparatus.

First Embodiment

Figure 1:
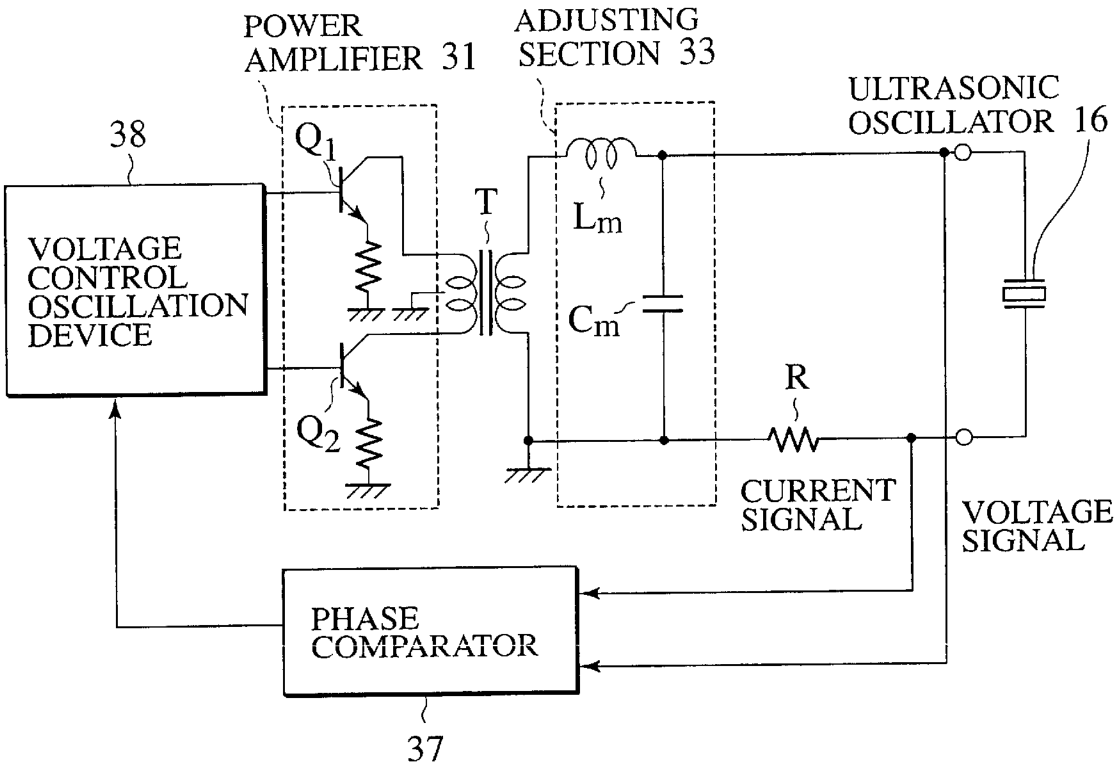
FIG. 1 is a circuit constitution of a first embodiment of an ultrasonic cleaning apparatus according to the present invention.

FIG. 1 is a circuit constitution diagram of a first embodiment of the ultrasonic cleaning apparatus according to the present invention. The circuit shown in FIG. 1 is a driving circuit for driving an ultrasonic oscillator, which is constituted by a power amplifier 31, a transformer T, an adjusting section 33, an ultrasonic oscillator 16, a phase comparator 37 and a voltage control oscillation device 38.

The power amplifier 31 has power transistors $Q_1$ and $Q_2$ connected in series with a primary winding of the transformer T disposed therebetween, and the power transistors $Q_1$ and $Q_2$ amplify an amplitude of a signal from the voltage control oscillation device 38. The power transistors $Q_1$ and $Q_2$ supply the amplified signal to the adjusting section 33 via the transformer T. The adjusting section 33 is constituted by a coil $L_m$ and a capacitor $C_m$ that is an impedance element for adjustment, and supplies the signal from the transformer T to the ultrasonic oscillator 16. The resistor R is inserted between the transformer T and the oscillator 16, and shows a low resistance.

A current flowing through the resistor R is detected as a current signal, and input to the phase comparator 37. Moreover, a voltage at one terminal of the ultrasonic oscillator 16 is detected as a voltage signal, and input to the phase comparator 37. The phase comparator 37 determines a difference between a phase of the detected current and a phase of the detected voltage, and generates a voltage in accordance with the phase difference.

Figure 2:
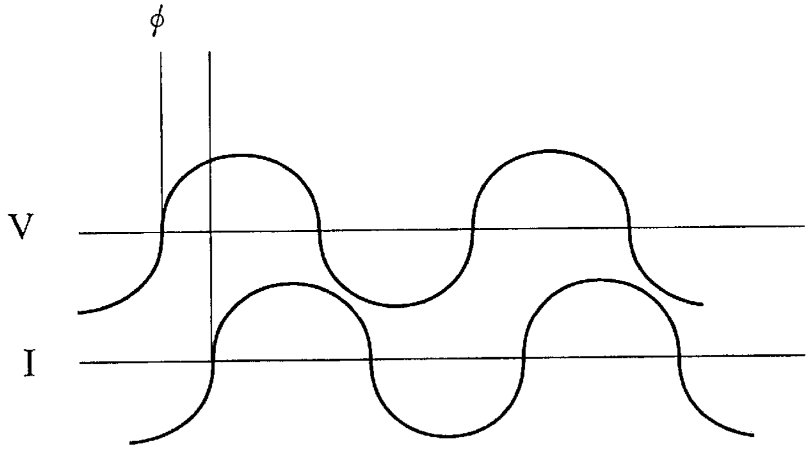
FIG. 2 is a diagram explaining a phase difference between a current flowing through an ultrasonic oscillator and a voltage across the ultrasonic oscillator.

The voltage control oscillation device 38 transmits a signal having a frequency in accordance with the voltage generated by the phase comparator 37, and controls the frequency so that the phase difference of the phase comparator 37 is held within ±30°. In FIG. 2, a diagram for explaining the phase difference Φ between the current I flowing through the ultrasonic oscillator and the voltage V across the ultrasonic oscillator is shown. Power supplied to the ultrasonic oscillator 16 is set to a range from 1 W to 10 W. This is because in order to obtain a compact-sized and handy ultrasonic cleaning apparatus, it is intended to make it possible to operate the ultrasonic cleaning apparatus with a battery or a chargeable battery. Noted that the ultrasonic cleaning apparatus may be connected to an electrical outlet directly by use of an AC adapter and the like.

Figure 3:
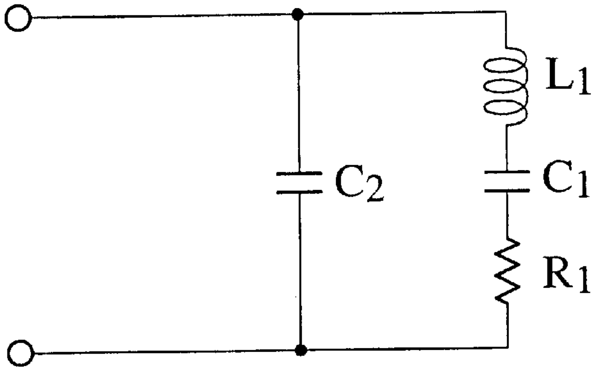
FIG. 3 shows an equivalent circuit of an ultrasonic oscillator of the first embodiment.
Figure 4:
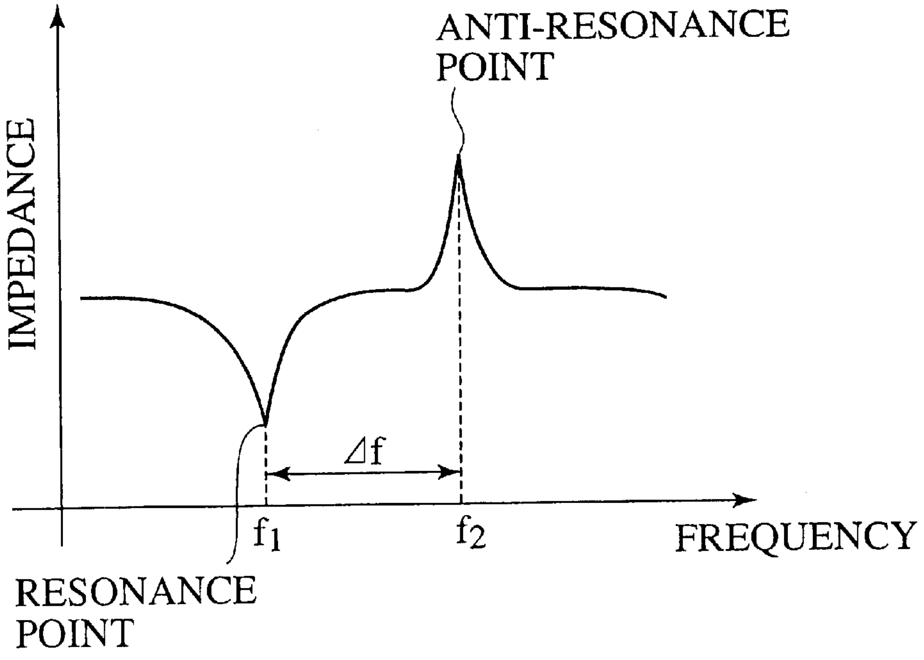
FIG. 4 is a diagram showing an impedance characteristic of the ultrasonic oscillator of the first embodiment for a frequency.

The ultrasonic oscillator 16 can be illustrated by an equivalent circuit as shown in FIG. 3. This equivalent circuit has a series circuit in which a coil $L_1$ having an inductance component, a capacitor $C_1$ having a capacitance component and a resistor $R_1$ are connected in series, and in which a capacitor $C_2$ is connected in parallel to the series circuit to constitute a parallel circuit. With this equivalent circuit, the ultrasonic oscillator 16 changes its impedance relative to a change of a frequency as shown in FIG. 4.

In this equivalent circuit, a series resonance is constituted by the coil $L_1$ and the capacitor $C_1$ schematically, and a resonance frequency $f_1$ at which the impedance is minimum is schematically obtained by the formula (1).

$$f_1=1/\{2\pi(L_1C_1)^{1/2}\} \quad (1)$$

Furthermore, in this equivalent circuit, a parallel resonance is constituted by the coil $L_1$ and the capacitor $C_2$ schematically, and an anti-resonance frequency $f_2$ at which the impedance is maximum is obtained by the formula (2) schematically.

$$f_2=1/\{2\pi(L_1C_2)^{1/2}\} \quad (2)$$

In general, since a value of $C_2$ is larger than that of $C_1$, the resonance frequency $f_1$ is lower than the anti-resonance frequency $f_2$ as shown in FIG. 3.

The ultrasonic oscillator 16 is a bolt-tightened "Langevin type piezoelectric oscillator, and its resonance frequency $f_1$ is set to a range of 20 kHz to 100 kHz. A difference $\Delta f$ between the resonance frequency $f_1$ of the ultrasonic oscillator 16 and the anti-resonance frequency $f_2$ thereof is regulated to 1 kHz or more.

As described above, since the difference $\Delta f$ of the resonance frequency $f_1$ of the ultrasonic oscillator 16 and the anti-resonance frequency $f_2$ thereof is regulated to 1 kHz or more, the ultrasonic oscillator 16 can oscillate stably and high efficiently even when a load change occurs. Accordingly, the ultrasonic cleaning apparatus can exhibit an excellent cleaning effect with less power and clean dirty clothes easily.

If the difference $\Delta f$ is preferably regulated to 1.2 kHz or more, the effect becomes more significant. More preferably, if the difference $\Delta f$ is regulated to 1.5 kHz or more, the effect becomes still more significant.

Figure 5:
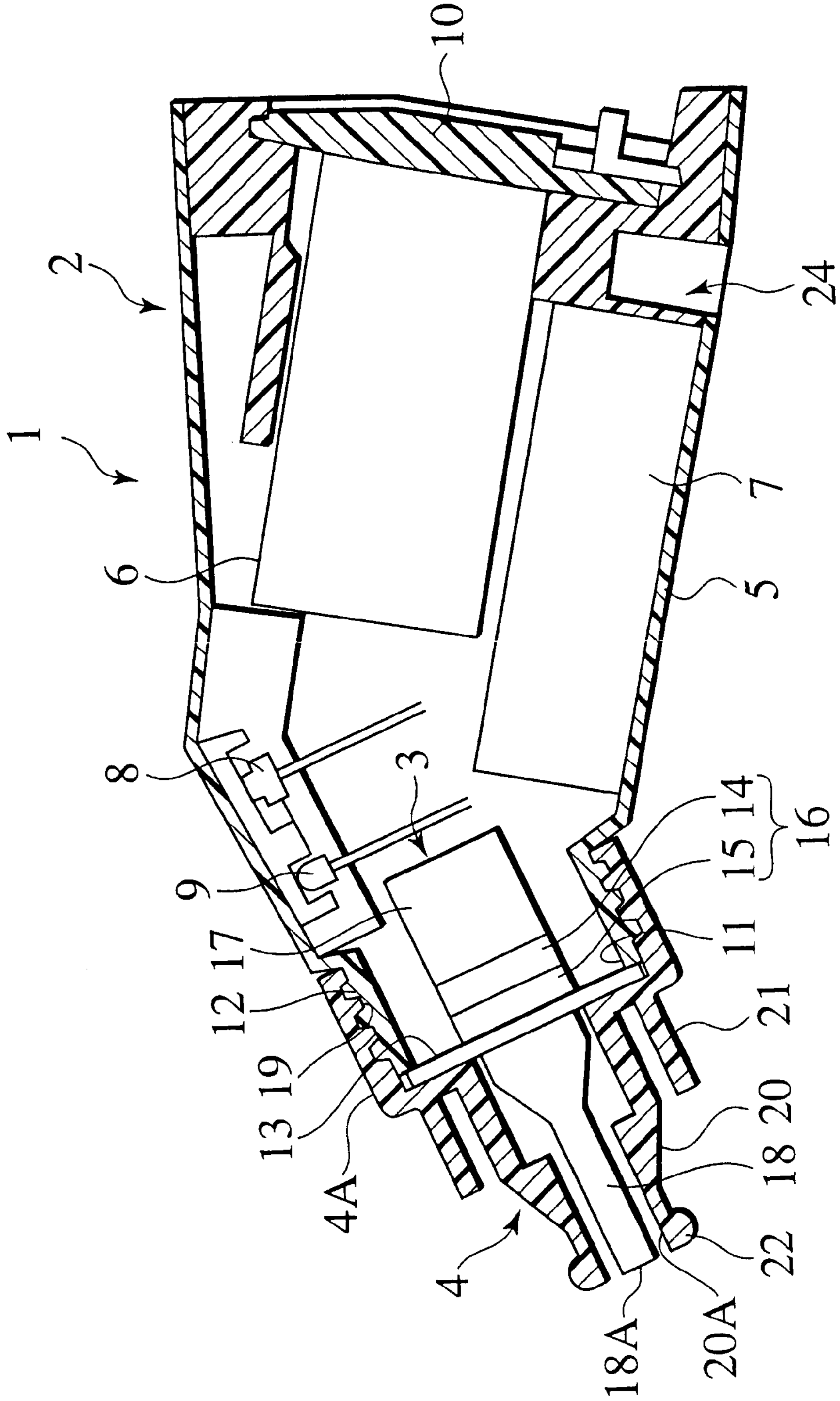
FIG. 5 is a sectional view showing the first embodiment of the ultrasonic cleaning apparatus according to the present invention.
Figure 6:
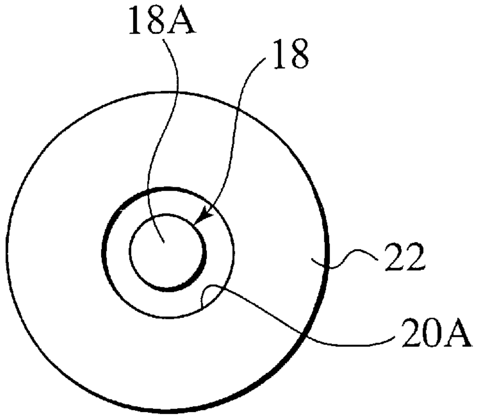
FIG. 6 is a front view showing a cover portion and a front ultrasonic phone in the ultrasonic cleaning apparatus of the first embodiment.

Next, a constitution of the ultrasonic cleaning apparatus of the first embodiment will be described. FIG. 5 is a section view of the ultrasonic cleaning apparatus of the first embodiment according to the present invention. FIG. 6 is a front view of a cover portion and a front ultrasonic phone in the ultrasonic cleaning apparatus of the first embodiment. The ultrasonic cleaning apparatus 1 is composed of an apparatus body 2, an ultrasonic oscillation portion 3 provided in the apparatus body 2 and a subject to be cleaned guiding cover 4 surrounding the ultrasonic oscillation portion 3.

The apparatus body 2 has an approximately cylindrical casing 5 which incorporates a battery housing portion 6, a driving circuit 7 for driving the ultrasonic oscillator 16 which corresponds to the driving circuit shown in FIG. 1, a switch portion 8 and a light emission diode 9 as a drive confirmation lamp. A reverse cover 10 fitted to an rear end portion of the casing 5 blocks up the battery housing portion 6. A male screw portion 12 formed at an external periphery surface of a front end portion of the casing 5 is screwed to a female screw portion 19 formed in the subject to be cleaned guiding cover 4.

The ultrasonic oscillation portion 3 is supported to a front end opening portion 11 of the casing 5 via a flange member 13, and is composed of the ultrasonic oscillator 16 constituted by joining piezoelectric units 14 and 15, a rear ultrasonic phone 17 jointed to a rear end surface of the ultrasonic oscillator 16, and a front ultrasonic phone 18 jointed to a front end surface of the ultrasonic oscillator 16. The piezoelectric units 14 and 15 is connected to the driving circuit 7 with lead wires (not shown), and supplied with power. The rear ultrasonic phone 17 and the front ultrasonic phone 18 are made of a metal which can changes a frequency of oscillation of the ultrasonic oscillator 16 to a specific frequency and easily propagate the oscillation of the ultrasonic oscillator 16 to strengthen the oscillation. The front ultrasonic phone 18 is composed of a large diameter sub-portion, a tapered sub-portion which reduces its diameter straightly from the large diameter sub-portion, and a small diameter sub-portion, and forwardly protrudes from the front end portion of the casing 5. Noted that the tapered sub-portion may reduce its diameter curvilinearly or stepwise.

A sustain portion 21 is formed so as to surround a cover portion 20, and the cover portion 20 is formed so as to surround the front ultrasonic phone 18. An external diameter of the cover portion 20 is set so as to be gradually smaller forwardly. The front ultrasonic phone 18 is out of contact with the cover portion 20 and a subject to be cleaned guiding ring portion 22 which surrounds the front ultrasonic phone 18. The front ultrasonic phone 18 has a structure in which the ultrasonic oscillation thereof is not apt to attenuate.

The number of the piezoelectric units 14 and 15 may be optional as long as it is more than one, and preferably two or four. The flange member 13 is fitted at a position where a node of the oscillation exists, and specifically fitted to the position ahead of the piezoelectric unit 15. By sustaining the ultrasonic phone at the position corresponding to the node of the oscillation thereof, it is possible to acquire a holding structure capable of providing the ultrasonic oscillation showing a small amount of attenuation.

Figure 7A:
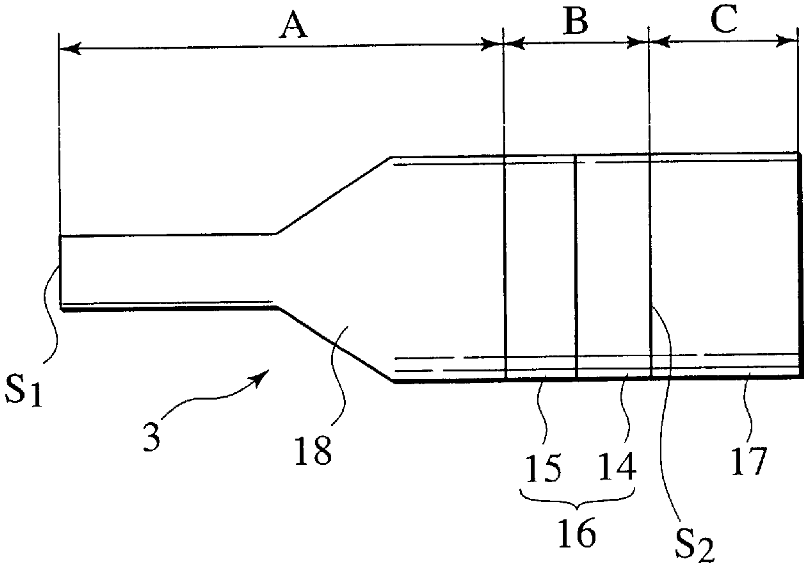
FIG. 7A is a side view of an ultrasonic oscillation portion of the first embodiment.
Figure 7B:
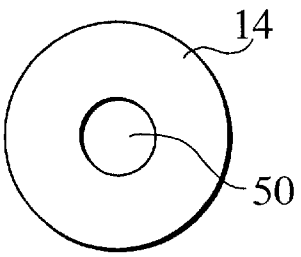
FIG. 7B is a rear view of a piezoelectric unit of the first embodiment.
Figure 8:
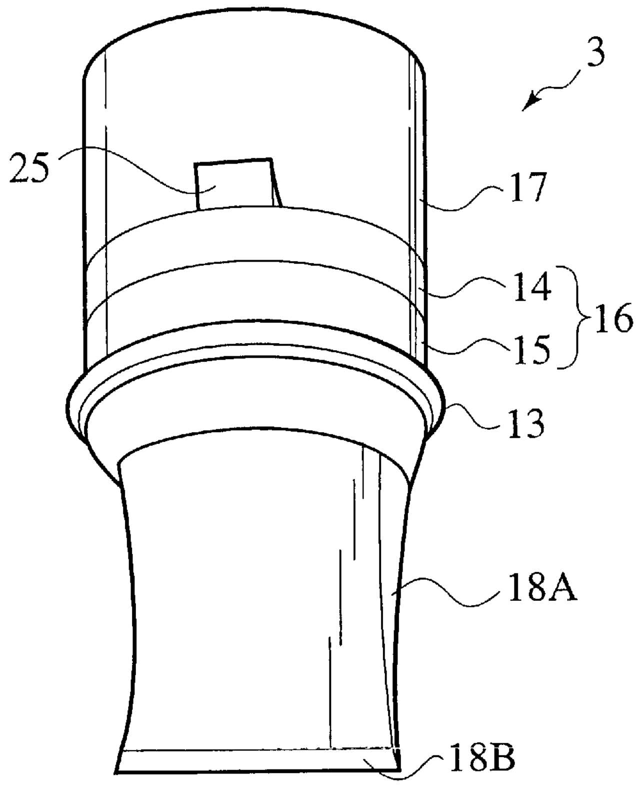
FIG. 8 is a perspective view of an ultrasonic oscillation portion of a first modification of the first embodiment.

In terms of an ultrasonic oscillation portion 3, as the piezoelectric units 14 and 15, used was the one obtained by carrying out a polarization treatment for a cylindrical piezoelectric unit (diameter: 15 mm and thickness: 4 mm) in its thickness direction, which contains PZT that is solid solution of $PbZrO_3$ and $PbTiO_3$ as a main component. Thus, as the ultrasonic oscillation portion 3, the Langevin ultrasonic oscillator was prepared, which was obtained by sandwiching the piezoelectric units 14 and 15 between the front and rear ultrasonic phones 17 and 18 made of aluminum while applying tightening torque of 55 kg·cm to the piezoelectric units 14 and 15 from the front and rear ultrasonic phones 17 and 18. Noted that, as shown in FIG. 7A, the length A of the front ultrasonic phone 18 was set to 33 mm; the length B of the ultrasonic oscillator 16, 8 mm; and the length C of the rear ultrasonic phone 17, 19 mm. The diameter of the rear ultrasonic phone 17 was set to 15 mm similarly to the piezoelectric units 14 and 15. Moreover, the area $S_1$ of the tip end plane 18A of the front ultrasonic phone 18 was set to 0.3 $cm^2$. Noted that even if there is a hollow at the tip end portion of the phone, the area $S_1$ is calculated supposing that there is not a hollow. Furthermore, the area $S_2$ of the piezoelectric units was set to 1.77 $cm^2$. When the diameter of the hollow formed in the piezoelectric units was subtracted from the area $S_2$, the actual area of the piezoelectric units is equal to 1.39 $cm^2$ (1.77−0.38=1.39 $cm^2$). Noted that, as shown in FIG. 7B, even when the piezoelectric units 14 and 15 have a hole 50 for fixing the phone 17, the area $S_2$ of the piezoelectric unit is calculated as the hole 50 does not exist. As a result, a ratio $S_2/S_1$ of the area $S_1$ of the tip end portion of the front ultrasonic phone 18 to the area $S_2$ of the piezoelectric unit is set to 5.9 (excluding the diameter of the hollow, 4.6). Noted that there is an advantage that energy of the piezoelectric unit is raised by firmly fixing the piezoelectric units 14 and 15 to the phone 17 by means of the hole 50.

Herein, $S_1$ is the area of the tip end portion of the front ultrasonic phone 18, that is, a cleaning surface. $S_2$ is a joint area of the piezoelectric unit jointing the phone.

The sustain portion 21 is formed so as to surround the cover portion 20, and the cover portion 20 is formed so as to surround the front ultrasonic phone 18. A dimension of an external diameter of the cover portion 20 is set so as to be smaller forwardly. The front ultrasonic phone 18 is out of contact with the subject to be cleaned guiding ring portion 22 and the cover portion 20 which surround the front ultrasonic phone 18, and a structure that the ultrasonic oscillation of the front ultrasonic phone 18 is not apt to attenuate is provided.

Other Constitution Examples of Ultrasonic Phone

Next other constitution examples of the ultrasonic phone will be described. The ultrasonic phone of the ultrasonic oscillation portion 3 shown in FIGS. 5 to 7 has a cylindrical shape (hereinafter referred to as a round phone). In this constitution example, the ultrasonic phone has a flat shape (hereinafter referred to as a flat phone). The constitution of this ultrasonic oscillation portion 3 will be described with reference to FIGS. 8 to 11.

Figure 10:
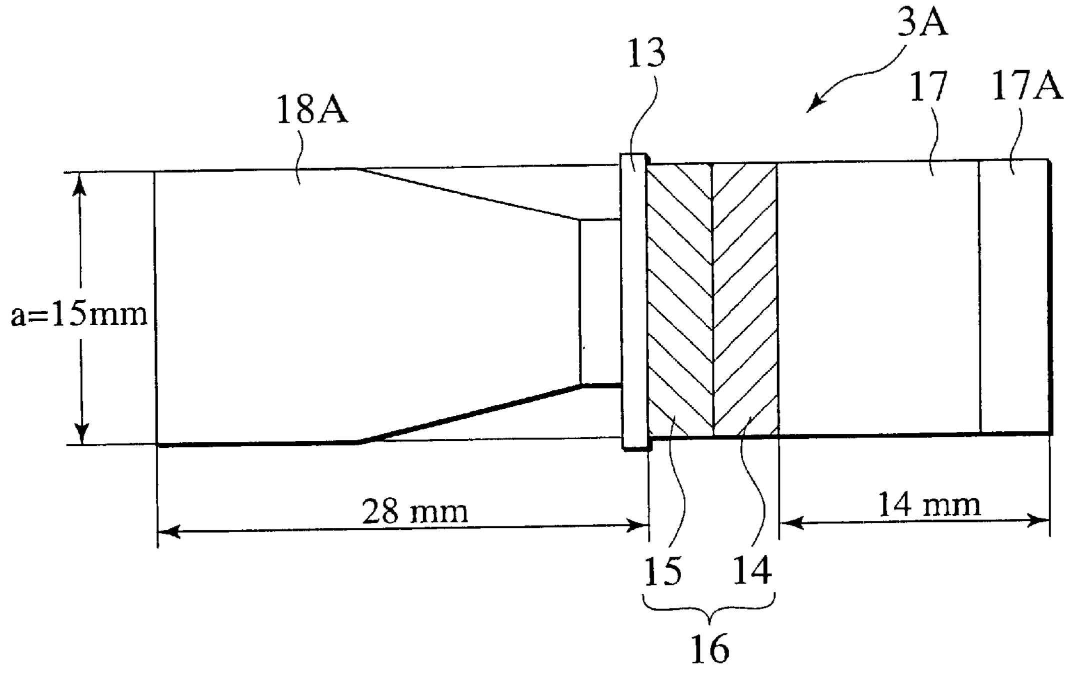
FIG. 10 is a plan view of the ultrasonic oscillation portion of the first modification.
Figure 11:
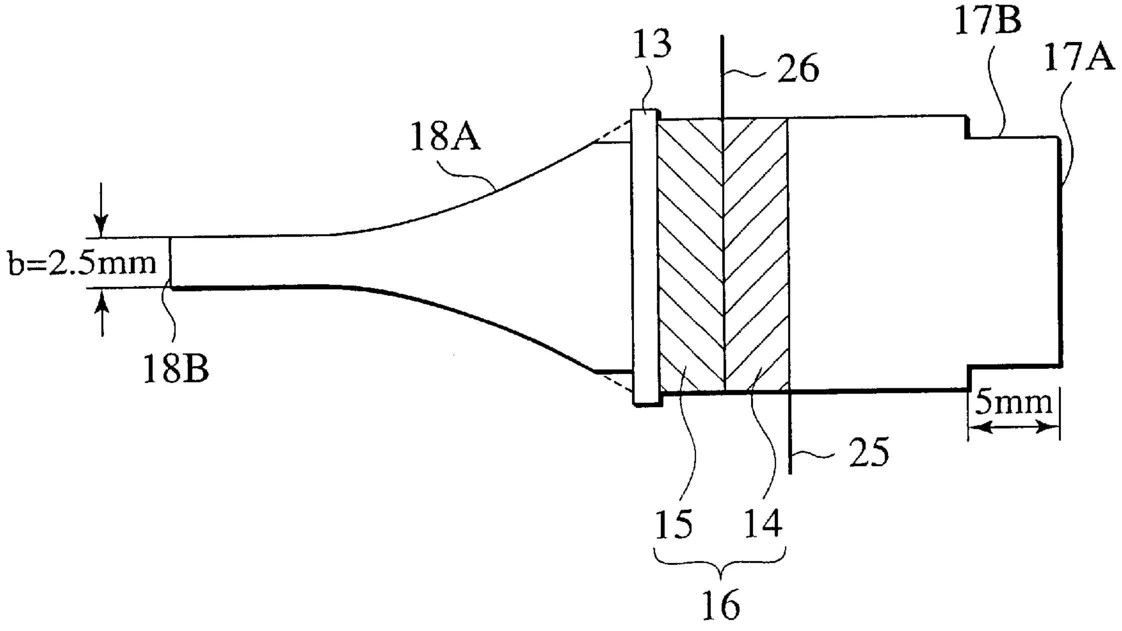
FIG. 11 is a side view of the ultrasonic oscillation portion of the first modification.

The ultrasonic oscillation portion 3 uses a Langevin ultrasonic oscillator (the ultrasonic oscillation portion 3) having the same constitution as that described in the above. Therefore, description for the ultrasonic oscillation portion 3 is omitted. As shown in FIG. 10, the length of the front ultrasonic phone 18A was set to 28 mm, and the length of the rear ultrasonic phone 17 was set to 14 mm. The diameter of the rear ultrasonic phone 17 was set to 15 mm similarly to the piezoelectric units 14 and 15, and a step portion 17B having a length of 5 mm in a longitudinal direction of the rear ultrasonic portion 17 was formed on both sides of the rear end portion of the rear ultrasonic phone 17 as shown in FIG. 11. An output of 6 W was applied between electrodes 25 and 26 of the element (piezoelectric unit), and a resonance frequency of the oscillator was 50 kHz. Moreover, the tip end of the front ultrasonic phone 18A is flat.

Figure 9:
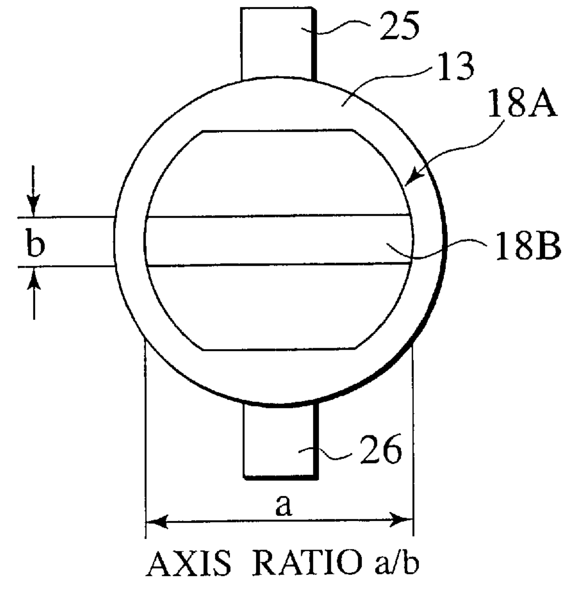
FIG. 9 is a front view of the ultrasonic oscillation portion of the first modification.

As shown in FIG. 9, the tip end plane 18B of the front ultrasonic phone 18A, which contacts the subject to be cleaned, has a rectangular shape. As shown in FIGS. 10 and 11, the length a of the long side long axis) of the rectangle is set to 15 mm, the length b of the short side (short axis) thereof is set to 2.5 mm and the area thereof is set to 37.5 $mm^2$. Specifically, an axis ratio R in the tip end plane 18B is a/b (=15/2.5), and, specifically, this axis ratio R is 6. In order to form the tip end plane 18B to a slender rectangle shape, the front ultrasonic phone 18A is formed to a shape in which the front ultrasonic phone 18A is made to be gradually thinner from its base portion to its tip as shown in FIG. 10.

The axis ratio R of the length a of the long axis in the tip end plane 18B of the front ultrasonic phone 18A to the length b of the short axis therein should be preferably set to a range of $2 \leqq R \leqq 10$. Thus, it is possible to drive the ultrasonic oscillator with a low output of 10 W or less. Noted that the tip end plane 18B of the front ultrasonic phone 18A may be elliptical, and if the axis ratio R of the length a of the long axis in the tip end plane 18B to the length b of the short axis therein is set to a range of $2 \leqq R \leqq 10$, the similar effects can be achieved.

Figure 12:
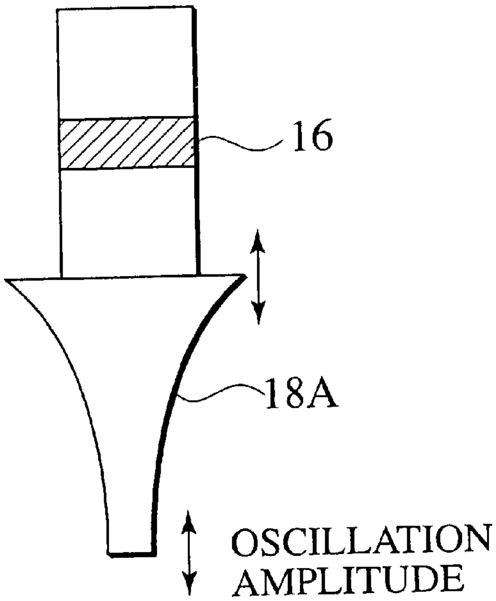
FIG. 12 shows a second modification of the ultrasonic oscillator and the ultrasonic phone.
Figure 13A:
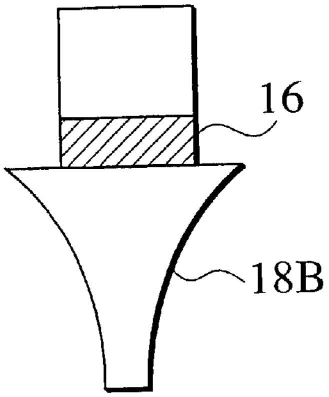
FIGS. 13A and 13B show a third modification of the ultrasonic oscillator and the ultrasonic phone.
Figure 13B:
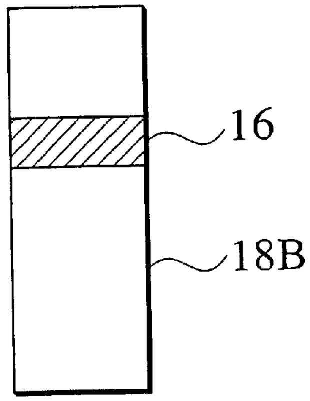

Moreover, other modifications of the ultrasonic oscillator and the ultrasonic phone are illustrated in FIGS. 12, 13A and 13B. In the modification illustrated in FIG. 12, the front ultrasonic phone 18A is made to be a tapered shape in which its diameter is smaller at a position closer to its tip end plane. With this tapered shape, the maximum value of an oscillation speed can be made to a range of 1 m/s to 10 m/s. Moreover, in the modification shown in FIGS. 13A and 13B, as shown in a side view of FIG. 13A and a front view of FIG. 13B, the maximum value of the oscillation speed can be made to a range of 1 m/s to 10 m/s by arranging the ultrasonic oscillator 16 at a boundary between the rear and front ultrasonic phones 17 and 18.

When the oscillation speed is set to 1 m/s or less, it is next to impossible to obtain cleaning effects. Furthermore, when the oscillation speed is set to 10 m/s or more under power ranging from 1 W to 10 W, a cleaning plane of a phone is extremely small. The cleaning effect is lessened or the subject to be cleaned is damaged, so that this phone cannot be used for an original cleaning.

According to the ultrasonic cleaning apparatus of the first embodiment constructed in the above described manner, the power supplied from the power amplifier 31 to the ultrasonic oscillator 16 is set to a range of 1 W to 10 W. If the power is below 1 W, an amplitude necessary for cleaning is not obtained. When high power exceeding 10 W is used, a little loss is ignored. Specifically, it is possible to exhibit excellent effects by use of a handy type lower power consumption ultrasonic cleaning apparatus which can be used at home with easiness.

The phase comparator 37 obtains the phase difference Φ between the phase of the detected current I and the phase of the detected voltage V, and generates a voltage in accordance with the phase difference Φ. For example, the phase comparator 37 generates the voltage equivalent to a time difference between a zero cross point of the voltage and a zero cross point of the current.

The voltage control oscillation device 38 generates a signal having a frequency in accordance with the voltage generated by the phase comparator 37, and controls the frequency so that the phase difference Φ obtained by the phase detector 37 is kept within ±30°. Accordingly, effective power supplied to the ultrasonic oscillator 16 can be increased, and influences of the phase shift due to the change of the load can be lessened. Noted that the effective power, for example, power P that is actually effective is expressed by P=VI cos Φ where V is the voltage, I is the current and Φ is the phase difference. Therefore, excellent cleaning effects can be exhibited with less power, and dirty clothes can be easily cleaned. Noted that when the phase difference Φ exceeds ±30°, the power P decreases to 87% of ideal power or less, and also detergency is lowered recognizably.

A breakdown limit of the ultrasonic oscillator 16 is 0.8 m/s of the oscillation speed at its operation end plane (tip end plane), when the ultrasonic oscillator 16 is an ordinary piezoelectric element. Therefore, as shown in FIG. 5, the rear and front ultrasonic phones 17 and 18 for amplifying the oscillation speed were jointed to the ultrasonic oscillator 16, and the maximum value of the oscillation speed at the tip end plane of the front ultrasonic phone 18 was set to a range of 1 m/s to 10 m/s. Specifically, by an amplitude increasing means such as an ultrasonic phone, it is possible to increase the oscillation speed of the ultrasonic oscillator 16 to 1.2 to 12 times as high as that of the ordinary piezoelectric element, whereby the cleaning effects can be further enhanced.

Second Embodiment

Figure 14:
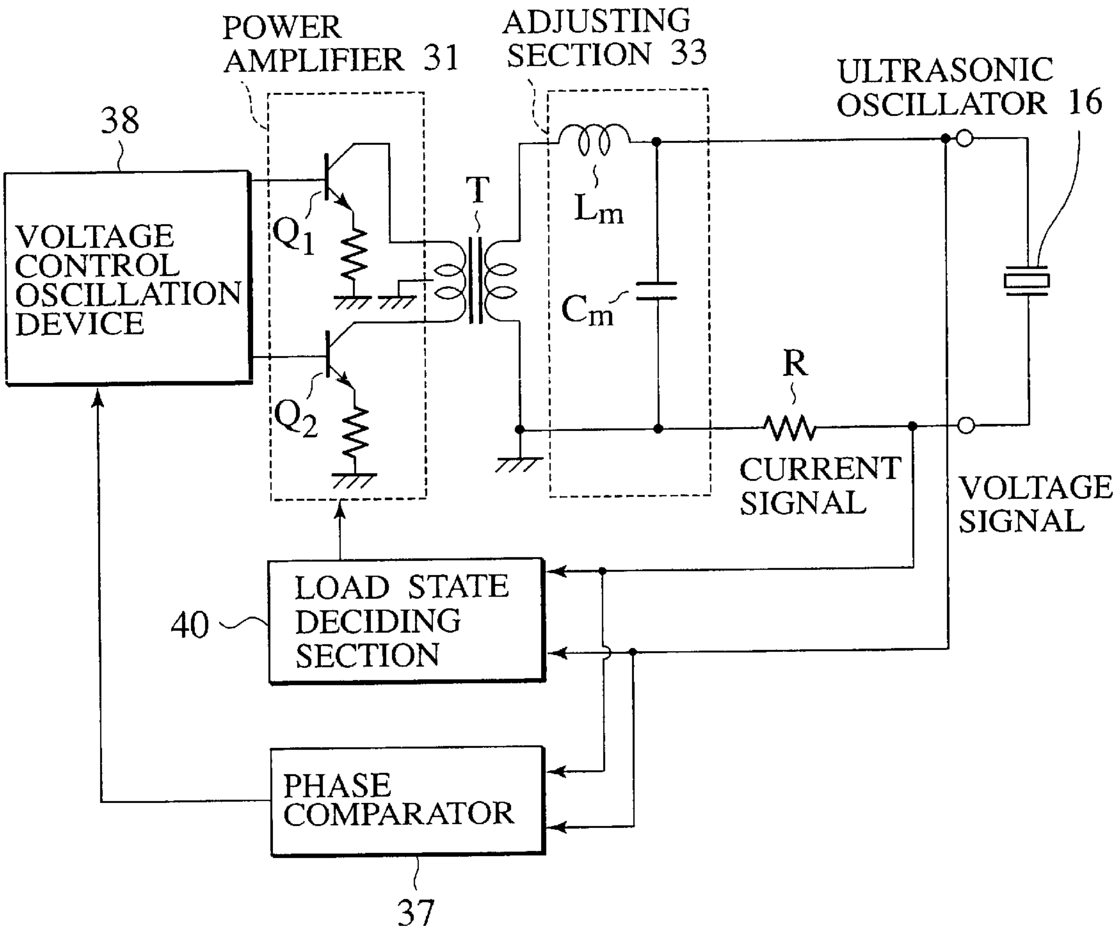
FIG. 14 is a circuit constitution of a second embodiment of the ultrasonic cleaning apparatus according to the present invention.

Next, an ultrasonic cleaning apparatus of a second embodiment will be described. As shown in FIG. 14, this ultrasonic cleaning apparatus further comprises a load state deciding section 40 for deciding based on a detected current and a detected voltage whether the loads are applied or not, in addition to the constituent components of the ultrasonic cleaning apparatus of the first embodiment shown in FIG. 1. In the ultrasonic cleaning apparatus of the second embodiment shown in FIG. 14, when no load is applied, the power amplifier 31 reduces power supplied to the ultrasonic oscillator 16 to approximately half as low as that of power or less in a state where the loads are applied.

According to the ultrasonic cleaning apparatus constructed as described above, the load state deciding section 40 decides based on a detected current and a detected voltage whether the loads are applied or not. In the state where no load is applied, since impedance indicated by a voltage effective value/a current effective value is equal to 100Ω or less, it is decided depending on the impedance whether the loads are applied or not. Noted that the impedance during a cleaning operation ranges from 150 to 900Ω and impedance varies depending on elements.

In the case where no load is applied, the power amplifier 31 decrease the power supplied to the ultrasonic oscillator 16 to approximately half as high as that of the power or less when the load are applied. Accordingly, the total power consumed in a unit cleaning operation is improved by about 30%, and it is possible to reduce heat generation of the circuit and heat generation of the elements due to waste power. For example, in the case where the power is not controlled, the power per the unit cleaning operation was 5 W·h, a temperature of the circuit was 85° C. and a temperature of the element was 60° C. In the case where the power is controlled, the power per the unit cleaning operation was 3.5 W·h, a temperature of the circuit was 50° C. and a temperature of the element was 40° C.

In this case, the unit cleaning operation was performed for 15 sec and the ultrasonic cleaning apparatus was raised for 5 sec. These operations were performed for 30 minutes continuously. When the ultrasonic cleaning apparatus was being raised, the switch SW was in a close state and no load was applied. The temperature of the circuit is measured by transistors and a transformer, which are circuit components generating heat. The temperature of the element is a temperature of the oscillator, and the element generates heat if the power is not reduced when no load is applied.

Third Embodiment

Figure 15:
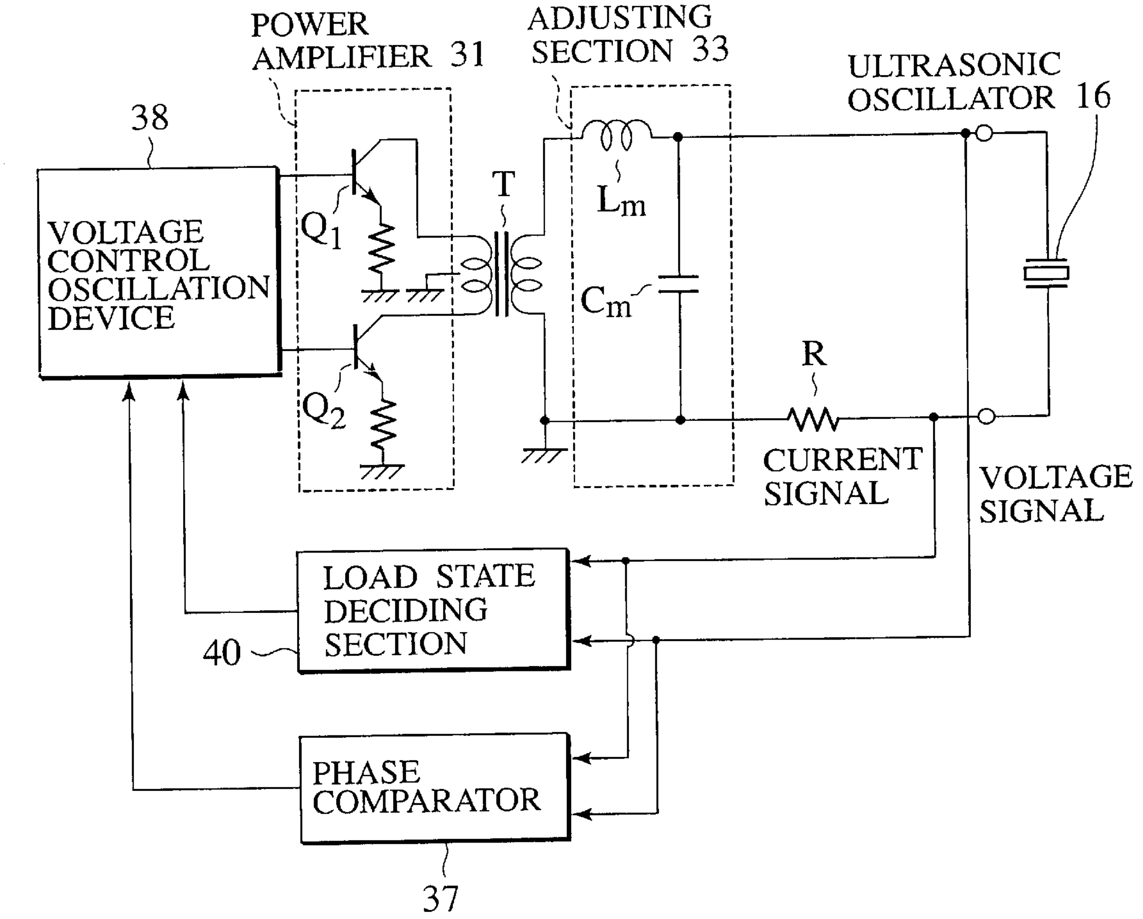
FIG. 15 is a circuit constitution of a third embodiment of the ultrasonic cleaning apparatus according to the present invention.

Next an ultrasonic cleaning apparatus of a third embodiment will be described. As shown in FIG. 15, this ultrasonic cleaning apparatus further comprises a load state deciding section 40 for deciding based on a detected current and a detected voltage whether a load is applied or not, in addition to the constituent components shown in FIG. 1. In the ultrasonic cleaning apparatus of the third embodiment shown in FIG. 15, a voltage control oscillation device 38 controls the phase difference to 60° or more by controlling the frequency, when no load is applied.

According to the ultrasonic cleaning apparatus constructed described above, the load state deciding section 40 decides based on the detected current and the detected voltage whether the load is applied or not. Since the decision of the load state is the same as that described in the second embodiment, descriptions are omitted.

Next, when no load is applied, the voltage control oscillation device 38 controls the phase difference Φ to 60° or more by controlling the frequency. Thus, it is possible to make the effective power (P=VI cos Φ) to ½ or less, so that the total power for the unit cleaning operation is improved by about 30% and heat generation of the circuit and heat generation of the element due to waste power can be reduced.

Fourth Embodiment

Figure 16:
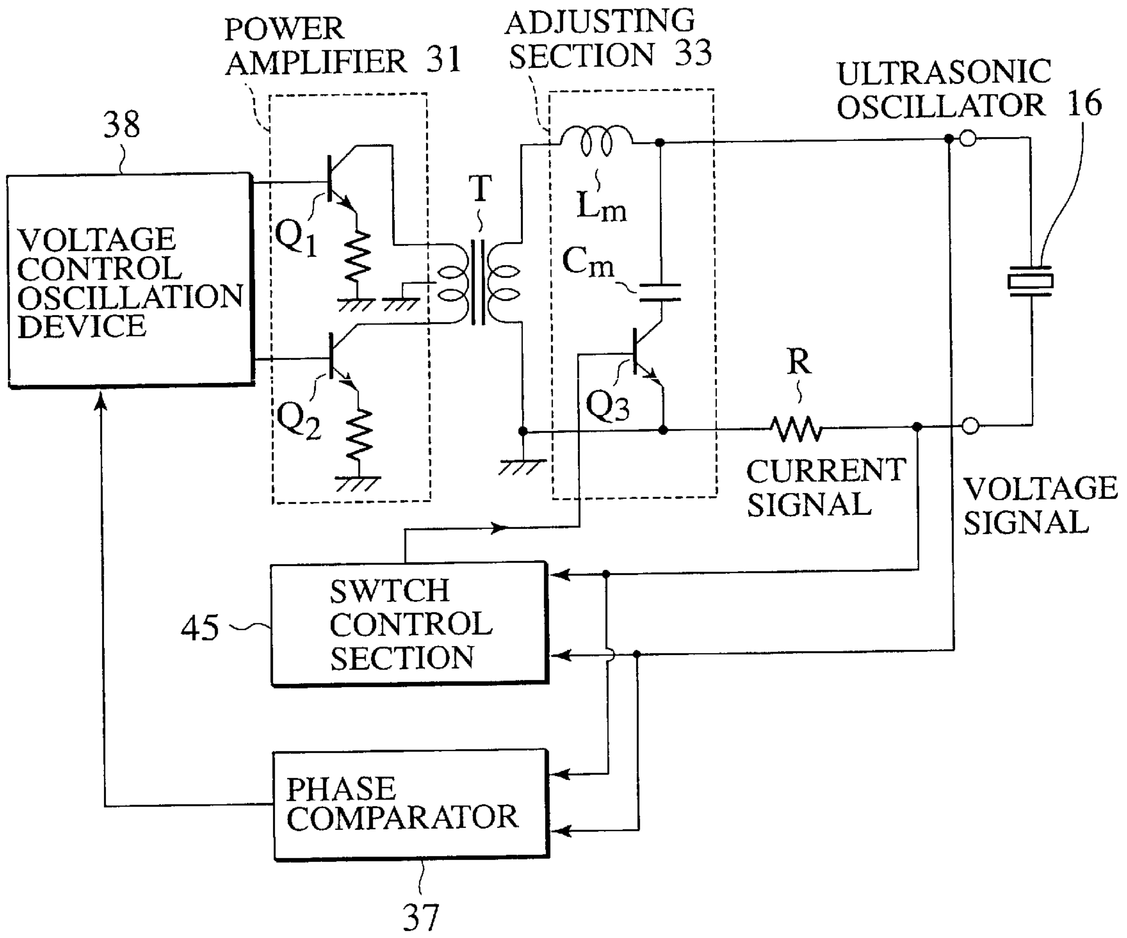
FIG. 16 is a circuit constitution of a fourth embodiment of the ultrasonic cleaning apparatus according to the present invention.

Next, an ultrasonic cleaning apparatus of a fourth embodiment will be described. As shown in FIG. 16, this ultrasonic cleaning apparatus comprises a switching transistor $Q_3$ connected in series to the capacitor $C_m$ as a waveform shaping capacitor, and a switch control section 45 for controlling the turning ON/OFF of the switching transistor $Q_3$, in addition to the constituent components of the ultrasonic cleaning apparatus shown in FIG. 1.

Based on the detected current value and the detected voltage value and an output from the phase comparator 37, the switch control section 45 keeps the switching transistor $Q_3$ in turning-off state until the phase difference between the phase of the voltage and the phase of the current of the ultrasonic oscillator 16 becomes equal to a predetermined value, for example, 30°. After the phase difference becomes equal to the predetermined value, the switch control section 45 controls so as to turn-on the switching transistor $Q_3$.

Specifically, by turning-off the switching transistor $Q_3$ until the phase difference becomes equal to the predetermined value, capacitance of the series capacitor constituted by the capacitor $C_m$ and the switching transistor $Q_3$, is made to about ½ of the capacitor $C_m$ or less, and a current flowing through the capacitor $C_m$ can be reduced. Thus, it is possible to save the power.

Furthermore, by setting a response time to 0.2 second or less, which is necessary for matching the phase difference between the current flowing through the ultrasonic oscillator 16 and the voltage across therethrough with the predetermined value, a response characteristic may be improved. Moreover, a duty ratio of on-time to off-time of a signal in the voltage control oscillation device 38 may be set to approximately ¼ or less until the phase difference between the voltage and the current becomes equal to the predetermined value. Thus, the output to the ultrasonic oscillator 16 can be lowered and power saving can be achieved.

Fifth Embodiment

Figure 17:
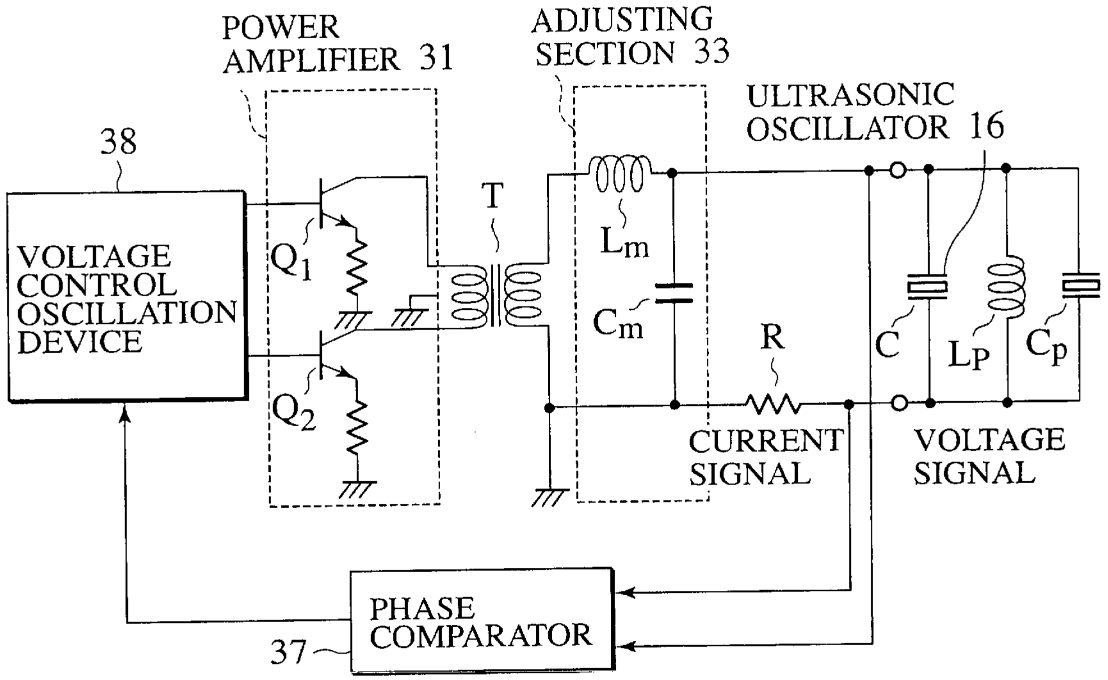
FIG. 17 is a circuit constitution of a fifth embodiment of the ultrasonic cleaning apparatus according to the present invention.

Next, an ultrasonic cleaning apparatus of a fifth embodiment will be described. FIG. 17 is a circuit constitution of the fifth embodiment of the ultrasonic cleaning apparatus according to the present invention. In the circuit of the fifth embodiment, when a difference between a resonance frequency of the ultrasonic oscillator 16 and an anti-resonance frequency thereof is equal to 1 kHz or less, an adjusting coil $L_p$ and an adjusting capacitor $C_p$ are connected in parallel to both end terminals of the ultrasonic oscillator 16, and a difference between a resonance frequency and an anti-resonance frequency of a synthesis circuit constituted by the adjusting coil $L_p$, the adjusting capacitor $C_p$ and the ultrasonic oscillator 16 is adjusted to 1 kHz or more when the difference between the resonance frequency and the anti-resonance frequency of the ultrasonic oscillator 16 is 1 kHz or less.

Herein, assuming that the capacitance of the ultrasonic oscillator 16 to be C, C is schematically a synthesis capacitance obtained by adding $C_1$ and $C_2$ to each other in the equivalent circuit shown in FIG. 3.

Even if the adjusting coil $L_p$ and the adjusting capacitor $C_p$ are connected in parallel to the ultrasonic oscillator 16, the series resonance is schematically constituted by the coil $L_1$ and the capacitor $C_1$. Therefore, since the resonance frequency is schematically represented by the above formula (1), the resonance frequency does not almost change.

On the other hand, when the adjusting coil $L_p$ and the adjusting capacitor $C_p$ are connected in parallel to the ultrasonic oscillator 16, the parallel resonance is schematically constituted by the capacitor C, the adjusting coil $L_p$ and the adjusting capacitor $C_p$. Therefore, the anti-resonance frequency is schematically represented by the formula (3), and hence the anti-resonance frequency changes.

$$f=1/[2\pi\{L_p(C+C_p)\}^{1/2}] \quad (3)$$

As described above, since the resonance frequency does not almost change, in order to adjust the difference between the resonance frequency and the anti-resonance frequency to 1 kHz or more, preferably to 1.2 kHz or more preferably to 1.5 kHz, the value of the adjusting coil $L_p$ and the value of the adjusting capacitor $C_p$ should be adjusted respectively so that the anti-resonance frequency becomes higher than that before the adjustment.

Moreover, instead of connecting both of the adjusting coil $L_p$ and the adjusting capacitor $C_p$ to the ultrasonic oscillator 16, only the adjusting coil $L_p$ is connected to the ultrasonic oscillator 16, and the value of the adjusting coil $L_p$ is adjusted. The difference between the resonance frequency and the anti-resonance frequency may be adjusted to 1 kHz or more, preferably to 1.2 kHz or more, and more preferably to 1.5 kHz or more.

Furthermore, instead of connecting both of the adjusting coil $L_p$ and the adjusting capacitor $C_p$ to the ultrasonic oscillator 16, only the adjusting capacitor $C_p$ is connected to the ultrasonic oscillator 16, and the value of the adjusting capacitor $C_p$ is adjusted. The difference between the resonance frequency and the anti-resonance frequency may be adjusted to 1 kHz or more, preferably to 1.2 kHz or more, and more preferably to 1.5 kHz or more.

As described above, the adjusting coil $L_p$ and the adjusting capacitor $C_p$ are connected in parallel to both end terminals of the ultrasonic oscillator 16, and the difference between the resonance frequency of the synthesis circuit and the anti-resonance frequency thereof, which is constituted by the adjusting coil $L_p$, the adjusting capacitor $C_p$ and the ultrasonic oscillator 16, is adjusted to 1 kHz or more, so that even if the load varies, stable oscillation is possible with a high efficiency. Accordingly, the ultrasonic cleaning apparatus of the present invention exhibits excellent cleaning effect with less power, and dirty clothes can be easily cleaned. When the difference between the resonance frequency and the anti-resonance frequency is preferably adjusted to 1.2 kHz or more, the effects become more significant. When the difference between the resonance frequency and the anti-resonance frequency is more preferably adjusted to 1.5 kHz or more, the effects become still more significant.

The applicant of the present invention measured stability of the oscillation by the difference between the resonance frequency and the anti-resonance frequency. The measurement results are shown in FIG. 19.

The measurement were conducted for the two kinds of phones including the round phone shown in FIGS. 5 to 7 and the flat phone shown in FIGS. 8 to 11 as the ultrasonic phone. In Table 1, $C_f$ represents the capacitance C of the ultrasonic oscillator, and "parallel L" represents the fact that the adjusting coil $L_p$ is connected to the ultrasonic oscillator. Examples 1 to 3 show that the adjusting coil Lp is not connected to the ultrasonic oscillator and $C_f$ ranges from 800 pF to 900 pF. Examples 1 to 3 correspond to the case of the ultrasonic oscillator 16 of the first embodiment. The difference between the resonance frequency and the anti-resonance frequency is adjusted to 1 kHz or more, and the oscillation stability is good (○) or the best (◎).

Examples 4 to 8 correspond to the case of the ultrasonic oscillator 16 of the fifth embodiment. Example 4 corresponds to the case where an adjusting coil of 15 mH is connected to the ultrasonic oscillator of Example 3. The difference between the resonance frequency and the anti-resonance frequency is adjusted to 1.5 kHz, and the oscillation stability is the best (◎). In Example 5, a thickness of the piezoelectric element is 2 mm, and no adjusting coil is used. $C_f$ is 1750 pF, and the difference between the resonance frequency and the anti-resonance frequency is adjusted to 0.5 kHz, so that the oscillation stability is rather bad (Δ). Example 6 corresponds to the case where an adjusting coil of 3.2 mH is connected to the ultrasonic oscillator of Example 5. The difference between the resonance frequency and the anti-resonance frequency is adjusted to −0.8 kHz (the anti-resonance frequency becomes lower than the resonance frequency), and the oscillation stability is bad (X). Example 7 corresponds to the case where an adjusting coil of 6 mH is connected to the ultrasonic oscillator of Example 5. The difference between the resonance frequency and the anti-resonance frequency is adjusted to 1.5 kHz, and the oscillation stability is the best (◎). Example 8 corresponds to the case where an adjusting coil of 10 mH is connected to the ultrasonic oscillator of Example 5. The difference between the resonance frequency and the anti-resonance frequency is adjusted to 1.2 kHz, and the oscillation stability is good (○).

From the above results, the value of the adjusting coil should be preferably set to a range from 5 mH to 200 mH.

The capacitance value of the ultrasonic oscillator should preferably set to a range of 10 pF to 3000 pF.

Figure 18:
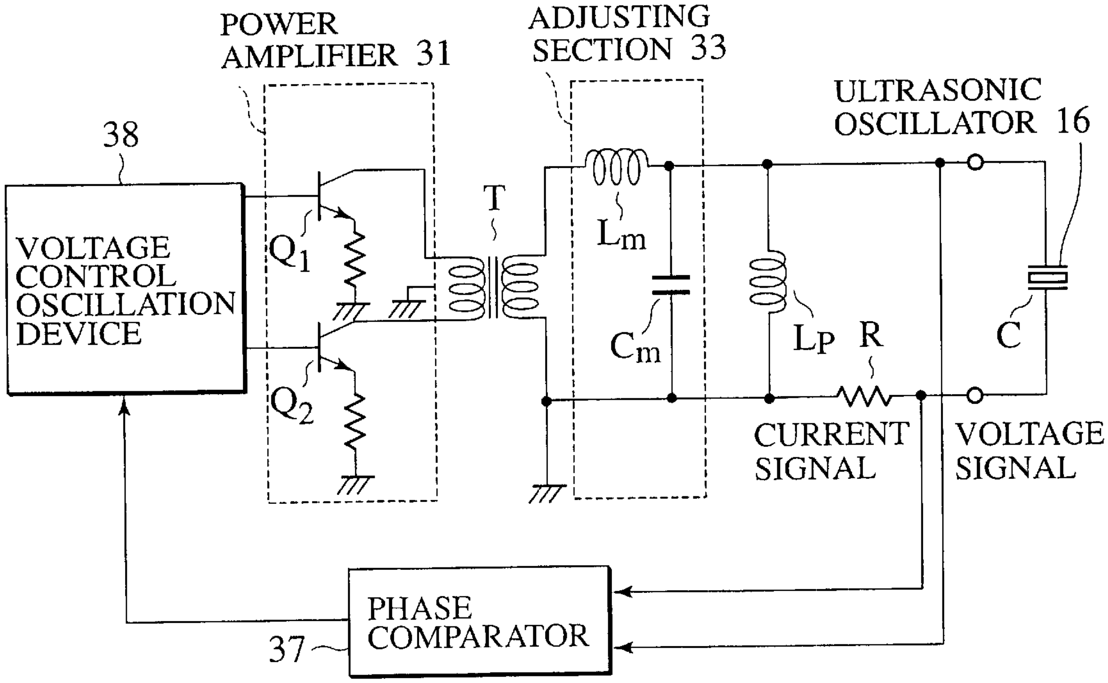
FIG. 18 is a circuit constitution in which a coil for adjusting a difference between a resonance frequency and an anti-resonance frequency is provided between an adjusting circuit and a current detection resistor.

In FIG. 17, since the resistor R is provided so as to be connected to each one end terminal of the adjusting section 33, the ultrasonic oscillator 16, the adjusting coil $L_p$ and the adjusting capacitor $C_p$, the stable and high efficiency oscillation is possible. As shown in FIG. 18, when the adjusting coil $L_p$ is provided between the adjusting section 33 and the resistor R, the oscillation may stop improperly.

As described above, according to the present invention, the power supplied to the ultrasonic oscillator is adjusted to a range from 1 W to 10 W, and the phase comparator generates the voltage in accordance with the phase difference between the current and the voltage. The voltage control oscillation device generates the frequency of the signal in accordance with the generated voltage, and controls the frequency so that the phase difference is kept at ±30°. Accordingly, the effective power applied to the ultrasonic oscillator can be increased, and influences of the phase difference due to the variation of the load can be lessened. As a result, the ultrasonic cleaning apparatus of the present invention can exhibit excellent cleaning effects with less power, and can clean dirty clothes easily.

Furthermore, according to the present invention, the ultrasonic phone connected to the ultrasonic oscillator amplifies the oscillation speed, and the maximum value of the oscillation speed in the tip end plane of the ultrasonic phone is set to a range from 1 m/s to 10 m/s. Therefore, it is possible to further enhance the cleaning effects.

Furthermore, according to the present invention, it is decided based on the detected current and the detected voltage whether the load is applied or not When no load is applied, the power supplied to the ultrasonic oscillator is made to be half that of in the load application state or less. Therefore, it is possible to achieve the power saving.

In addition, according to the present invention, it is decided based on the current and the voltage whether the load is applied or not. When no load is applied, the phase difference is controlled to 60° or more by controlling the frequency, and the effective power can be reduced to ½ or less. Therefore, the power saving can be achieved.

Still furthermore, according to the present invention, the power supplied to the ultrasonic oscillator is set to a range from 1W to 10W, and the difference between the resonance frequency of the ultrasonic oscillator and the anti-resonance frequency thereof is adjusted to 1 kHz or more. Thus, even if the load varies, the stable and high efficiency oscillation is possible. Accordingly, the high cleaning effects can be exhibited with less power, and the dirty clothes can be easily cleaned.

Furthermore, according to the present invention, the power supplied to the ultrasonic oscillator is set to a range from 1W to 10W, and at least one passive element of the coil and the capacitor is connected in parallel to the ultrasonic oscillator. The difference between the resonance frequency of the synthesis circuit and the anti-resonance frequency thereof, which is constituted by the passive element and the ultrasonic oscillator, is adjusted to 1 kHz or more. Thus, even when the load varies, the stable and high efficiency oscillation is possible. Accordingly, the excellent cleaning effect is exhibited with less power, and the dirty clothes and the like can be easily cleaned.

In addition, according to the present invention, the ultrasonic oscillator is the Langevin type piezoelectric oscillator, and the resonance frequency of the ultrasonic oscillator is set to a range from 20 kHz to 100 kHz. Accordingly, the cleaning efficiency is high, and the excellent effect can be exhibited with less power, and the dirty clothes and the like can be easily cleaned.

Still furthermore, according to the present invention, since the value of the coil is set to a range from 5 to 200 mH and the value of the capacitor is set to a range of 10 to 3000 pF, the difference between the resonance frequency of the ultrasonic oscillator and the anti-frequency thereof is adjusted to 1 kHz or more. Thus, even when the load varies, the stable and high efficiency oscillation is possible. Therefore, the excellent cleaning effect can be exhibited with less power, and the dirty clothes and the like can be easily cleaned.

According to the present invention, since the detector is provided among the adjusting circuit, the ultrasonic oscillator and the passive element, the stable and high efficiency oscillation is possible. Accordingly, the excellent cleaning effects can be exhibited with less power, and the dirty clothes and the like can be easily cleaned.

The present invention is not limited to the ultrasonic cleaning apparatus of the first to fifth embodiments. In the first to fifth embodiments, the phase difference between the phase of the voltage of the ultrasonic oscillator 16 and the phase of the current thereof is compared, and the frequency of the signal is controlled based on the phase difference. For example, the frequency of the signal may be controlled based on one of the current value of the ultrasonic oscillation 16 and the voltage value thereof.

In the first to fifth embodiments, the adjusting section 33 is provided. For example, this adjusting section 33 may be omitted. In the first to fifth embodiments, the resistor R is used for the resistor for the current detection. A current probe and the like may be used in stead of the resistor R.

Moreover, in the first to fifth embodiments, the materials forming the front ultrasonic phone 18 and the rear ultrasonic phone 17 were made to be identical, and the front ultrasonic phone 18 and the rear ultrasonic phone 17 were made to possess the same ultrasonic oscillation characteristic. Thus, the strong detergency was obtained by getting large oscillation energy. For example, the front ultrasonic phone 18 and the rear ultrasonic phone 17 may be designed so that the front ultrasonic phone 18 and the rear ultrasonic phone 17 have approximately the identical ultrasonic oscillation characteristic. The materials showing approximately the same ultrasonic oscillation characteristic mean the ones having compositions equal to each other by 90% or more. Incidentally, in the materials showing the different ultrasonic oscillation characteristics, since propagation speeds of the oscillation are different from each other, balance is apt to be lost owing to the oscillation, and it is impossible to get large oscillation energy.

Furthermore, in the above described embodiment, though the front ultrasonic phone 18 and the rear ultrasonic phone 17 are made from aluminum, other metals such as stainless and alloys can be employed. In the present invention, as the materials of the front ultrasonic phone 18 and the rear ultrasonic phone 17, a nonmetallic material can be used. As the nonmetallic material, there have been, for example, ceramics such as glass, alumina and zirconia, plastics such as polystyrene, ABS and Bakelite, and composites consisting of them. A sound propagation speed should be equal to 2000 m/sec or more.

The entire content of a Japanese Patent Application No. P2000-297392 with a filing date of Sep. 28, 2000 and No. P2001-52872 with a filing date of Feb. 27, 2001 is herein incorporated by reference.

Although the invention has been described above by reference to the preferred embodiment, the invention is not limited to the embodiment described above will occur to those skilled in the art, in light of the teachings. The scope of the invention is defined with reference to the following claims.

What is claimed is:

1. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator; and a controller for controlling a frequency of said signal depending on an output detected by the detector, a switching transistor connected between said power amplifier and said ultrasonic oscillator, a switch control section connected to said switching transistor, wherein said switch control section turns off said switching transistor until a phase difference becomes equal to a predetermined value, and turns on said switching transistor after said phase difference becomes equal to said predetermined value, and wherein said power supplied to said ultrasonic oscillator is set to a range from 1W to 10W.

2. An ultrasonic cleaning apparatus which cleans a subject to be cleaned by utilizing oscillation generated by an ultrasonic oscillator; comprising:

a power amplifier for amplifying an amplitude of a signal to supply the signal as power to said ultrasonic oscillator;

a detector for detecting a state of said ultrasonic oscillator;

a controller for controlling a frequency of said signal depending on an output detected by the detector; and a load state decision section for deciding based on the current flowing through said ultrasonic oscillator and the voltage applied to said ultrasonic oscillator whether a load is applied or not, wherein said power supplied to said ultrasonic oscillator is set to a range from 1W to 10W, and wherein, when no load is applied, said power amplifier regulates said power supplied to said ultrasonic oscillator to ½ that when the load is applied or less.

3. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator, said detector is a phase comparator for obtaining a difference between a phase of a current flowing through said ultrasonic oscillator and a phase of a voltage applied to said ultrasonic oscillator and for generating the voltage in accordance with the phase difference;

a controller for controlling a frequency of said signal depending on an output detected by the detector, said controller is a voltage control oscillation device for generating a signal having a frequency in accordance with the voltage generated by the phase comparator and for controlling said frequency so that said phase difference is kept within a predetermined phase range; and a load state decision section for deciding based on the current flowing through said ultrasonic oscillator and the voltage applied to said ultrasonic oscillator whether a load is applied or not, wherein said power supplied to said ultrasonic oscillator is set to a range from 1W to 10W, and wherein, when no load is applied, said voltage control oscillation device controls said frequency to regulate said phase difference to 60° or more.

4. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator; and a controller for controlling a frequency of said signal depending on an output detected by the detector, wherein said power supplied to said ultrasonic oscillator is set to a range from 1W to 10W and a difference between a resonance frequency of said ultrasonic oscillator and an anti-resonance frequency thereof is regulated to 1 kHz or more, and wherein said ultrasonic oscillator is a Langevin type piezoelectric oscillator, and a resonance frequency thereof is set to a range from 20 kHz to 100 kHz.

5. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator, wherein the power supplied to said ultrasonic oscillator from said power amplifier is set to a range from 1W to 10W, and wherein at least one passive element of a coil and a capacitor is connected in parallel to said ultrasonic oscillator, and a difference between a resonance frequency of a synthesis circuit and an anti-resonance frequency thereof close to the resonance frequency is regulated to 1 kHz or more, the synthesis circuit being constituted by the passive element and the ultrasonic oscillator.

6. The ultrasonic cleaning apparatus according to claim 5, wherein a value of said coil is set to a range from 5 to 200 mH and a value of said capacitor is set to a range from 10 to 3000 pF.

7. The ultrasonic cleaning apparatus according to claim 5, wherein an adjusting circuit is provided between said power amplifier and said ultrasonic oscillator, the adjusting circuit being for adjusting an impedance between said power amplifier and said ultrasonic oscillator, wherein a phase comparator is provided among said adjusting circuit and said ultrasonic oscillator.

8. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator; and a controller for controlling a frequency of said signal depending on an output detected by the detector, wherein said power supplied to said ultrasonic oscillator is set to a range from 1W to 10W and wherein a difference between a resonance frequency of said ultrasonic oscillator and an anti-resonance frequency thereof is regulated to 1.5 kHz or more.

9. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator, said detector is a phase comparator for obtaining a difference between a phase of a current flowing through said ultrasonic oscillator and a phase of a voltage applied to said ultrasonic oscillator and for generating the voltage in accordance with the phase difference; and a controller for controlling a frequency of said signal depending on an output detected by the detector, said controller is a voltage control oscillation device for generating a signal having a frequency in accordance with the voltage generated by the phase comparator and for controlling said frequency so that said phase difference is kept within a predetermined phase range;

wherein said power supplied to said ultrasonic oscillator is set to a range from 1W to 10W, and wherein at least one passive element of a coil and a capacitor is connected in parallel to said ultrasonic oscillator, and a difference between a resonance frequency of a synthesis circuit and an anti-resonance frequency thereof close to the resonance frequency is regulated to 1.2 kHz or more, the synthesis circuit being constituted by said passive element and said ultrasonic oscillator.

10. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator, said detector is a phase comparator for obtaining a difference between a phase of a current flowing through said ultrasonic oscillator and a phase of a voltage applied to said ultrasonic oscillator and for generating the voltage in accordance with the phase difference; and a controller for controlling a frequency of said signal depending on an output detected by the detector, said controller is a voltage control oscillation device for generating a signal having a frequency in accordance with the voltage generated by the phase comparator and for controlling said frequency so that said phase difference is kept within a predetermined phase range;

wherein said power supplied to said ultrasonic oscillator is set to a range from 1W to 10W, and wherein at least one passive element of a coil and a capacitor is connected in parallel to said ultrasonic oscillator, and a difference between a resonance frequency of a synthesis circuit and an anti-resonance frequency thereof close to the resonance frequency is regulated to 1.5 kHz or more, the synthesis circuit being constituted by said passive element and said ultrasonic oscillator.

11. An ultrasonic cleaning apparatus which cleans a subject to be cleaned by utilizing oscillation generated by an ultrasonic oscillator, comprising:

a power amplifier for amplifying an amplitude of a signal to supply the signal as power to said ultrasonic oscillator;

a detector for detecting a state of said ultrasonic oscillator; and a controller for controlling a frequency of said signal depending on an output detected by the detector, wherein at least one passive element of a coil and a capacitor is connected in parallel to said ultrasonic oscillator, and a difference between a resonance frequency of a synthesis circuit and an anti-resonance frequency thereof close to the resonance frequency is regulated to 1 kHz or more, the synthesis circuit being constituted by the passive element and the ultrasonic oscillator.

* * * * *